United States Patent
Di Cioccio et al.

(10) Patent No.: US 11,305,372 B2
(45) Date of Patent: Apr. 19, 2022

(54) METHOD OF ASSEMBLY BY DIRECT BONDING BETWEEN TWO ELEMENTS, EACH ELEMENT COMPRISING PORTIONS OF METAL AND DIELECTRIC MATERIALS

(71) Applicant: COMMISSARIAT A L'ENERGIE ATOMIQUE ET AUX ENERGIES ALTERNATIVES, Paris (FR)

(72) Inventors: Lea Di Cioccio, Saint Ismier (FR); Yann Beilliard, Upie (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 418 days.

(21) Appl. No.: 14/504,701

(22) Filed: Oct. 2, 2014

(65) Prior Publication Data

US 2015/0097022 A1    Apr. 9, 2015

(30) Foreign Application Priority Data

Oct. 3, 2013 (FR) ...................... 13 59591

(51) Int. Cl.
*H01L 21/18* (2006.01)
*B23K 20/00* (2006.01)
(Continued)

(52) U.S. Cl.
CPC ............ *B23K 20/002* (2013.01); *B23K 20/24* (2013.01); *B23K 31/02* (2013.01); *H01L 21/187* (2013.01);
(Continued)

(58) Field of Classification Search
CPC . H01L 2924/00012; H01L 2224/80895; H01L 2224/80896; H01L 2224/05571;
(Continued)

(56) References Cited

U.S. PATENT DOCUMENTS 4,803,422 A * 2/1989 Ignatowski .......... G01R 31/281
                                                                228/104
5,176,499 A * 1/1993 Damlis .................. B23P 15/04
                                                                29/888.024
(Continued)

FOREIGN PATENT DOCUMENTS

FR    2 913 145 A1    8/2008
FR    2 963 158 A1    1/2012
(Continued)

OTHER PUBLICATIONS

Di Cioccio et al., "An Overview of Patterned Metal/Dielectric Surface Bonding: Mechanism, Alignment and Characterization", Journal of The Electrochemical Society, 158 (6) p. 81-p. 86 (Year: 2011).*

(Continued)

*Primary Examiner* — Erin B Saad
*Assistant Examiner* — Carlos J Gamino
(74) *Attorney, Agent, or Firm* — Oblon, McClelland, Maier & Neustadt, L.L.P.

(57) ABSTRACT

Method of assembly of a first element (I) and a second element (II) each having an assembly surface, at least one of the assembly surfaces comprising recessed metal portions (6, 106) surrounded by dielectric materials (4, 104) comprising:
A) a step to bring the two assembly surfaces into contact without application of pressure such that direct bonding is obtained between the assembly surfaces, said first and second assemblies (I, II) forming a stack with a given thickness (e),
B) a heat treatment step of said stack during which the back faces (10, 110) of the first (I) and the second (II) elements are held in position so that they are held at a fixed distance (E) between the given stack thickness+/−2 nm.

17 Claims, 4 Drawing Sheets

(51) Int. Cl.

| | |
|---|---|
| *B23K 20/24* | (2006.01) |
| *B23K 31/02* | (2006.01) |
| *H05K 3/46* | (2006.01) |
| *H01L 23/00* | (2006.01) |
| *H01L 25/065* | (2006.01) |
| *H01L 25/00* | (2006.01) |
| *B23K 101/36* | (2006.01) |

(52) U.S. Cl.
CPC .............. *H01L 24/05* (2013.01); *H01L 24/06* (2013.01); *H01L 24/74* (2013.01); *H01L 24/80* (2013.01); *H01L 25/0657* (2013.01); *H01L 25/50* (2013.01); *H05K 3/4611* (2013.01); *B23K 2101/36* (2018.08); *H01L 2224/05009* (2013.01); *H01L 2224/05571* (2013.01); *H01L 2224/05647* (2013.01); *H01L 2224/05655* (2013.01); *H01L 2224/05657* (2013.01); *H01L 2224/05693* (2013.01); *H01L 2224/06505* (2013.01); *H01L 2224/06517* (2013.01); *H01L 2224/08145* (2013.01); *H01L 2224/75754* (2013.01); *H01L 2224/80035* (2013.01); *H01L 2224/80097* (2013.01); *H01L 2224/80136* (2013.01); *H01L 2224/80895* (2013.01); *H01L 2224/80896* (2013.01); *H01L 2224/80906* (2013.01); *H01L 2224/80935* (2013.01); *H01L 2224/80948* (2013.01); *H01L 2224/80986* (2013.01); *H01L 2224/95* (2013.01); *H01L 2225/06513* (2013.01)

(58) Field of Classification Search
CPC . H01L 2224/05647; H01L 2224/05693; H01L 2224/80097; H01L 2224/80136; H01L 2224/80906; H01L 2224/80986; H01L 2224/95; H01L 21/187
USPC .................................................. 228/44.3, 212
See application file for complete search history.

(56) References Cited

U.S. PATENT DOCUMENTS

| | | | | | |
|---|---|---|---|---|---|
| 6,129,257 | A * | 10/2000 | Xu | .......................... | B23K 3/087 228/144 |
| 6,142,361 | A * | 11/2000 | Downes, Jr. | ............ | H01L 24/81 228/173.1 |
| 6,799,714 | B2 * | 10/2004 | Gleason | ............. | H05K 13/0069 228/212 |
| 7,550,107 | B2 * | 6/2009 | Morrison | ............... | C04B 35/117 264/640 |
| 8,360,304 | B2 * | 1/2013 | Kang | .................... | B23K 20/007 228/180.5 |
| 8,505,178 | B2 * | 8/2013 | Farlow | ............... | H05K 13/0069 228/44.3 |
| 8,802,538 | B1 * | 8/2014 | Liu | ......................... | H01L 25/50 438/455 |
| 8,828,797 | B2 * | 9/2014 | Coudrain | ................ | H01L 24/80 438/107 |
| 9,728,453 | B2 * | 8/2017 | Tseng | ................ | H01L 21/76895 |
| 9,953,941 | B2 * | 4/2018 | Enquist | ................... | H01L 24/80 |
| 2003/0086775 | A1 * | 5/2003 | Farassat | ............ | H01L 21/67778 414/403 |
| 2003/0138993 | A1 * | 7/2003 | Nakamura | ............ | H01L 21/563 438/107 |
| 2005/0257877 | A1 * | 11/2005 | Stark | ..................... | H01L 21/187 156/182 |
| 2008/0009123 | A1 * | 1/2008 | Kostrzewa | ................. | C09J 5/02 438/455 |
| 2008/0205027 | A1 * | 8/2008 | Coronel | .............. | H01L 25/0657 361/820 |
| 2012/0097296 | A1 * | 4/2012 | Di Cioccio | ....... | H01L 21/76883 148/516 |
| 2012/0100657 | A1 * | 4/2012 | Di Cioccio | ......... | B81C 1/00269 438/51 |
| 2012/0187180 | A1 * | 7/2012 | Lombardi | ............ | B23K 1/0016 228/135 |
| 2012/0252162 | A1 * | 10/2012 | Sadaka | ................... | H01L 24/80 438/107 |
| 2013/0270328 | A1 * | 10/2013 | Di Cioccio | ......... | H01L 21/2007 228/176 |
| 2013/0320556 | A1 * | 12/2013 | Liu | ......................... | H01L 24/08 257/774 |
| 2014/0283367 | A1 | 9/2014 | Berthier et al. | | |
| 2014/0342528 | A1 | 11/2014 | Sabbione et al. | | |
| 2015/0171050 | A1 * | 6/2015 | Chen | ...................... | H01L 24/02 257/784 |
| 2017/0062366 | A1 * | 3/2017 | Enquist | ................... | H01L 24/05 |
| 2021/0375829 | A1 * | 12/2021 | Or-Bach | ................ | H01L 23/66 |

FOREIGN PATENT DOCUMENTS

| | | | |
|---|---|---|---|
| WO | WO 2012/130730 A1 | 10/2012 | |
| WO | WO-2012131075 A1 * | 10/2012 | ............. H01L 24/08 |

OTHER PUBLICATIONS

U.S. Appl. No. 14/354,402, filed Apr. 25, 2014, 2014-0342528, Sabbione, et al.
U.S. Appl. No. 14/221,402, filed Mar. 21, 2014, 2014-0283367, Berthier, et al.
Léa Di Cioccio, et al., "An Overview of Patterned MetallDielectric Surface Bonding: Mechanism, Alignment and Characterization", Journal of Electrochemical Society, vol. 158, Issue 6, 2011, pp. 81-86.
Léa Di Cioccio, et al., "Enabling 3D Interconnects with Metal Direct Bonding", Proceedings of the 2009 IEEE, International Interconnect Technology Conference, 2009, pp. 152-154.
Chuan Seng Tan, "Recent Progress in Copper-based Wafer Bonding for 3-D ICs Application", Published in: Electronic Materials, and Packaging, 2008, EMPA, 2008, International Conference on Oct. 22-24, 2008, IEEE, pp. 45-48.
K.N. Chen, et al., "Bonding Parameters of Blanket Copper Wafer Bonding", Journal of Electronic Materials, vol. 35, No. 2, 2006, 5 pages.
H. L. Leong, et al., "Experimental characterization and modeling of the contact resistance of Cu—Cu bonded interconnects", Journal of Applied Physics, 105, 033514, 2009, 6 pages.
Lan Peng, et al., "Bump-less Cu—Cu Bonding for 3D Integration of ICs by Wafer-on-Wafer Stacking", IEEE Electron Device Letters, May 13, 2010, 4 pages.
Riko I. Made, et al., "Experimental characterization and modeling of the mechanical properties of Cu—Cu thermocompression bonds for three-dimensional integrated circuits", Acta Materialia, 60, 2012, pp. 578-587.
Kuan-Neng Chen, "Cu—Cu Bonding", Department of Electronics Engineering, Published in Handbook of Wafer Bonding Wiley CH P Ramm , J Q Lu. M V Taklo editors, 2012. ISBN 978-3-527-32646-4, p. 161 Thermocompression Cu—Cu bonding of blanket and patterned wafers—K N Chen and C Stan, 25 pages.
French Preliminary Search Report dated Jun. 30, 2014 in French Application 13 59591, filed on Oct. 3, 2013 (with English translation of categories of cited documents).
Tadatomo Suga et al. "Surface Activated Bonding for New Flip Chip and Bumpless Interconnect Systems", 2002 Proceedings $52^{nd}$ Electronic Components and Technology Conference, 2002, 7 pages.

* cited by examiner

METHOD OF ASSEMBLY BY DIRECT BONDING BETWEEN TWO ELEMENTS, EACH ELEMENT COMPRISING PORTIONS OF METAL AND DIELECTRIC MATERIALS

TECHNICAL FIELD AND PRIOR ART

This invention relates to an improved method of assembly of two elements by direct bonding, the surface to be assembled of at least one of these elements comprising portions of metal and portions of dielectric material, this method can be used particularly for making microelectronic and nanoelectronic devices.

Three-dimensional integration in microelectronic and nanoelectronic devices can reduce the size of devices, reduce their electricity consumption, and increase transmission rates, performances, operating frequency, etc.

Three-dimensional integration may particularly include bonding steps for the alignment of connection pads, thinning and vertical interconnection through the stack.

The TSV (Through Silicon Via) technology that consists of making connection vias through silicon will be used. However, it is preferable to assemble elements and particularly connections by metal-metal bonding directly, to obtain a high interconnection density and to simplify the technology.

For example, copper is one metal used frequently for making connection pads.

Thermocompression is a technique for assembly of such elements. This technique consists of bringing elements into contact with each other and squeezing the elements together under a high pressure, for example between 4 kN and 10 kN. In general annealing then takes place, the pressure then no longer being applied. Annealing can also take place while the pressure is applied. Application of this pressure is aimed at compressing surface roughness in order to increase the contact surface area to achieve atomic diffusion of metal atoms.

The surfaces to be assembled may be composed of copper portions separated by portions of dielectric material, or more generally delimited portions of metal within a surface of dielectric material.

For an assembly by thermocompression, the copper portions project above the dielectric material surrounding them. The assembly can also be obtained by crushing the roughness.

However, application of pressure can damage microelectronic and nanoelectronic devices. Furthermore, during assembly it is required to get the best possible alignment of the copper pads in one element with the copper pads in the other element. But the alignment obtained with the thermocompression assembly technique cannot always be satisfactory.

The direct bonding technique can be used to obtain a significantly better alignment quality.

This bonding technique allows particular preparation of surfaces to be brought into contact in terms of roughness and hydrophily.

In the case in which the surfaces to be assembled are composed of copper portions separated by portions of dielectric material, the copper portions are recessed from the dielectric material surrounding them, and when they are brought into contact, the dielectric portions, for example the oxide portions, come into contact. This first step in creating contact may take place at ambient temperature and at atmospheric pressure without the application of any pressure.

A heat treatment then takes place, for example at a temperature of 400° C., during which copper portions facing each other expand and come into contact and bond together.

This technique is described For example in document "*An Overview of Patterned Metal/Dielectric Surface Bonding: Mechanism, Alignment and Characterization*, L. Di Cioccio and Al, *Journal of Electrochemical Society*, Vol. 158, Issue 6, p81-86, 2011.

The recess can be neutralised by expansion if the copper portions are not recessed too far, this recessing depth is also called "dishing". If there is too much dishing, the copper portions will not come into contact during the heat treatment and electrical contacts between the copper pads of the two elements are not satisfactory.

PRESENTATION OF THE INVENTION

Consequently, one purpose of the invention is to provide an improved assembly method by direct bonding of structures comprising mixed surfaces facing each other, the mixed surfaces comprising metal and one or more dielectric materials in order to obtain a good bond between the metal portions despite considerable dishing.

The above-mentioned purpose is achieved by an assembly method comprising a step bringing at least one mixed surface supported by an element into contact with a surface of another element without application of pressure, and a heat treatment step of the assembly during which the two elements are kept in contact with each other without the application of pressure.

The inventors have observed that simply holding the elements to be assembled together can give a bond between at least one recessed portion of metal and another surface that may comprise at least one recessed portion of metal, even in the case of severe dishing.

In other words, the elements to be assembled are kept together such that during the heat treatment, the stack is for example approximately the same thickness as the stack after the step to bring the elements into contact to facilitate bringing the metal pads into contact during their expansion when the two elements comprise metal pads. Contact and the bond between the metal portions is facilitated by holding the elements in position.

With this invention, it is possible to make a heat treatment at lower temperature or to obtain satisfactory bonding with more severe initial dishing without changing the heat treatment temperature.

It would be possible to implement a flattening step of one or both of the elements to be assembled in the case of a planeness defect before the step to bring the surfaces into contact or before or during the heat treatment, for example by applying a force of less than 3 kN.

A subject-matter of the present invention is then a method of assembly of a first and a second elements each having a back face and an assembly surface by direct bonding, at least the assembly surface of the first element comprising at least one portion with at least one metal part surrounded by at least one dielectric material, said metal portion having a free surface recessed from the dielectric material at said assembly surface, said method comprising:

A) a step to bring the two assembly surfaces into contact without application of pressure such that direct bonding is obtained between the assembly surfaces, said step taking place at at least one first temperature, said first and second assemblies forming a stack with a thickness, B) a heat treatment step of said stack at at least one second temperature, method in which, during at least a first phase of step B), the back faces of the first and the second elements are held in position so that they are held at a fixed distance between the stack thickness−2 nm and the stack thickness+2 nm.

Preferably during step B), the back faces of the first and second elements are held in position such that they are held at a fixed distance between the stack thickness−1 nm and the stack thickness+1 nm.

For example, the assembly surface of the second element comprises at least one portion that is at least partly metallic surrounded by at least one dielectric material, said metal portion having a free surface recessed from the dielectric material at said assembly surface, and in which contact is made during step A) so as to align the metal portion of a surface of the first element and the metal portion of a surface of the second element.

During step B), the stack may be placed between two holding devices that will be in plane contact with the back faces of the first and second elements, the distance separating the two holding devices being between the stack thickness−2 nm and the stack thickness+2 nm.

The second heat treatment temperature may be adjusted as a function of the recess of the metal portions from the dielectric material at the assembly surfaces.

Preferably, the recess of the surfaces of the metal portions from the surface of dielectric material is less than or equal to 20 nm.

Step A) advantageously takes place at ambient temperature and atmospheric pressure.

The at least one second temperature in the heat treatment step may be between 50° C. and 400° C.

In one variant of the assembly method, when the stack is curved, the method may include a stack flattening step before or after step A) and before and/or during the heat treatment in order to eliminate said curvature. Preferably, a force less than or equal to 3 kN is applied to the stack so as eliminate the curvature.

Before step A), there is advantageously:

a) at least one assembly surface polishing step such that the roughness of the surfaces is less than 0.7 nm RMS, and hydrophily is less than 20°.

Advantageously, during step B), the back faces of the first and second elements are held in place during a first phase and they are no longer held in place during a second phase, the second phase possibly taking place at the same temperature as the first phase or at a different temperature.

The surfaces of said holding devices are preferably at least as large as the surface area of the back faces of the first and second elements.

The metal portions may be made of copper, aluminum, tungsten or titanium, and the dielectric material may be an oxide or a nitride such as $SiO_2$, SiOCH, $Si_3N_4$, $Al_2O_3$.

The method may assemble several first elements to several second elements simultaneously.

The first and the second elements may be microelectronic and/or nanoelectronic substrates, the metal portions forming electrical interconnections.

BRIEF DESCRIPTION OF THE DRAWINGS

This invention will be better understood after reading the following description and the appended drawings in which.

DETAILED PRESENTATION OF PARTICULAR EMBODIMENTS

In one example embodiment, the method according to this invention consists of making an assembly by direct bonding for example between two surfaces comprising metal portions, for example copper, and dielectric material portions, for example $SiO_2$. As a variant, it is possible that at least one of the surfaces should include metal portions delimited by dielectric material portions within portions of a third material, for example a semiconducting material.

Metal portions in microelectronic and nanoelectronic devices fulfil a connection pad function and their dimensions are sufficient to perform this function.

The assembly of two elements for which the surfaces to be brought into contact have different structures lies within the scope of this invention. For example, this invention is applicable to the assembly of an element with one or more metal portions surrounded by dielectric portions and an element comprising a metal layer on its assembly face only.

The invention is also applicable to the assembly of two elements, one of which or both comprise a layer covering the metal portions and the dielectric portions, for example a dielectric layer, for example an oxide layer.

Direct bonding, sometimes called molecular bonding, is understood as bringing two approximately plane surfaces into contact during which the two approximately plane surfaces bond to each other without the addition of an adhesive material.

In the following description, the method according to this invention will be described in the context of bonding two elements that will be used to make microelectronic or nanoelectronic devices, and particularly to make the connection of copper connection pads, but the method according to this invention is applicable to bonding of metal portions that are not necessarily connection pads. For example, they may be through vias. The method according to the invention can also be used in all fields in which it is required to assemble mixed surfaces.

Figure 1:
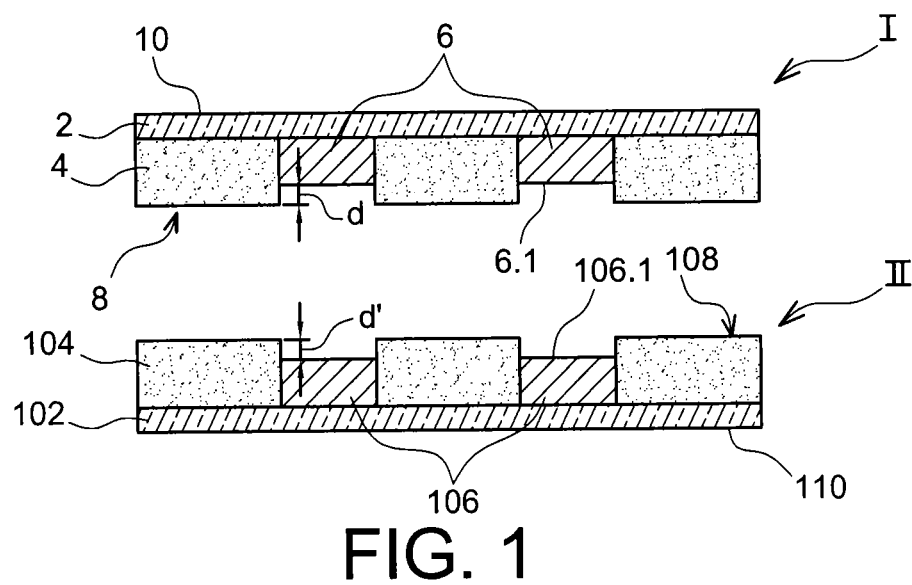
FIG. 1 is a diagrammatic view of an example of two elements to be assembled.

FIG. 1 diagrammatically shows an example of a first I and a second II element that will be assembled using the method according to this invention.

The first element I comprises an assembly surface 8 and a back face 10. The first element is formed from a substrate 2 for example made of silicon, a layer of dielectric material 4 for example $SiO_2$, and metal pads for example copper pads 6 in the etched zones of the dielectric material 4. The pads 6 have a free surface 6.1 recessed from a free surface of the layer 4 corresponding to the assembly surface. This recess is called dishing. The depth of this dishing is denoted d.

This dishing is formed during polishing steps of a composite surface.

The second element II that is shown in FIG. 1 has a similar structure. It comprises an assembly surface 108 and a back face 110. The second element II is formed from a substrate 102 for example made of silicon, a layer of dielectric material 104 for example $SiO_2$ placed on the substrate 102, and metal pads 106 for example made of copper in etched zones of the dielectric material 104. The pads 106 have a free area 106.1 recessed from a free surface of the layer 104 corresponding to the assembly surface. This recess is called dishing. The depth of this dishing is denoted d'.

Alternately, the metal of the metal portions may be aluminum, tungsten, titanium, etc.

Alternately, the dielectric material may be more generally an oxide or a nitride such as SiOCH, $Si_3N_4$, $Al_2O_3$, etc.

Figure 4:
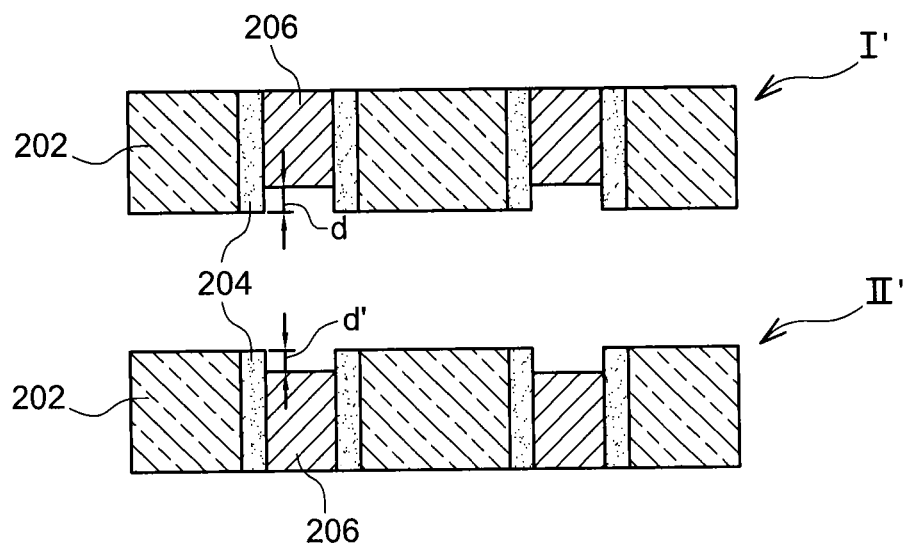
FIG. 4 is a diagrammatic view of another example of elements that can be assembled by the method according to the invention.

As a variant as shown in FIG. 4, the elements I" and II" might comprise pads 206 passing through the entire substrate 202 forming Through Silicon Vias (TSV) and being electrically isolated from this substrate by a dielectric zone 204 surrounding the pads 206.

Figure 5:
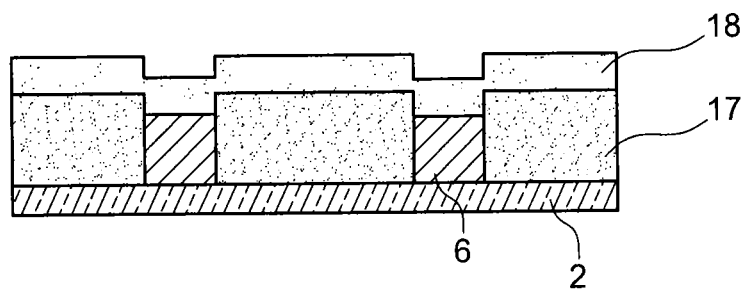
FIG. 5 is a diagrammatic view of another example of elements that can be assembled by the method according to the invention.

FIG. 5 shows another variant of an element that can be assembled, this for example comprising a layer 18 covering the metal pads 6 and the dielectric material. In particular, the material in the layer 18 may be a dielectric, an oxide or a nitride. As a variant, the material in the layer 18 may be chosen among CoWB, CoWP, NiP, NiWB, NiW, NiB, NiReP, NiMoP, NiWP, CoWPB, CoWBO, CoMoPO, the layer 18 for example forming a diffusion barrier.

The assembly method according to the invention comprises:

A) a step to bring the element surfaces into contact without application of pressure, B) a heat treatment step of the stack formed in step A).

For the purposes of this application, "application without pressure" means the lack of any external pressure applied to the elements when they are brought into contact, contact being achieved by the weight of the top element alone. In the case of a flattening step that will be described later, "without application of pressure" means application of a force of less than 3 kN or even less than 1 kN.

Surfaces brought into contact to obtain direct bonding have a roughness and a hydrophily enabling direct bonding at these zones in contact immediately that they are brought into contact.

The roughness is preferably less than 0.7 nm RMS (Root Mean Square), and even more preferably less than or equal to 0.3 nm RMS. This roughness is obtained by polishing, for example Chemical Mechanical Polishing (CMP). Preferably, the surfaces are hydrophilic in nature. This hydrophilic nature is obtained for example after a step to clean said surfaces in order to eliminate the presence of particles due to polishing. Advantageously, a step to reactivate at least portions of dielectric material may be performed before the contact step such that the nature of the surfaces is hydrophilic. In this application, a surface is considered to be hydrophilic if the contact angle is between 0° and 20°, and preferably it will be as small as possible. Preferably, the hydrophily of the surface is less than or equal to 10°.

The conditions necessary for chemical mechanical polishing for copper-copper bonding are for example as described in document "*Enabling 3D Interconnects with Metal Direct Bonding*", Di Cioccio et Al., *Proceedings of the 2009 IEEE International Interconnect Technology Conference*, pages 152-154, 2009". Similar conditions are applicable for the preparation of other materials, adapting the method to the materials involved, for example slurries used for polishing are chosen as a function of the materials used.

After polishing, the free surface of the copper pads 6.1, 106.1 then has a dish-shaped profile, recessed from free surfaces of portions made of dielectric material.

The dishing d, d' of these recesses is preferably less than 20 nm.

Dishing of recesses may be controlled by polishing parameters, for example the pressure, polishing time and the choice of the slurry(ies). It also depends on the surface area and density of the pads.

According to one embodiment, step A) to bring the two elements into contact takes place as follows:

The two assembly surfaces 8, 108 of elements are brought facing each other, the copper pads 6 are made to approximately face the copper pads 106 and the surfaces are brought into contact. As explained above, the free faces 6.1, 106.1 of the copper pads 6, 106 are set back from the surfaces, dishing is for example between 5 nm and 10 nm on a 500 nm high 5 μm square metal pad.

Figure 2A:
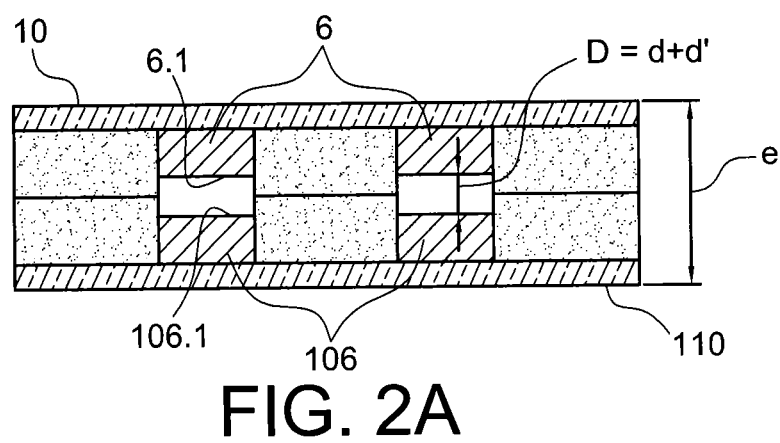
FIGS. 2A to 2C are diagrammatic views of steps in the method according to one embodiment.

The surfaces of the dielectric portions come into contact and bond by direct hydrophilic bonding, this direct bonding can be obtained at ambient temperature and at atmospheric pressure. Due to the existing dishing on the two facing copper faces, the copper faces are not in contact during this step A). At the end of step a), the free faces of portions 6 and 106 facing each other are separated by a distance D=d+d' (FIG. 2A).

The thickness e of the stack thus formed at the end of step A) is defined between the back faces of the elements. In this embodiment, there is no need for the elements to be held in contact with each other.

During a next step, a heat treatment is applied to the stack thus formed in order to bring the copper pads of the two elements into contact.

For example, the heat treatment temperature may be of the order of 400° C.

During this heat treatment step, a holding tool is used to keep the two elements at a constant distance. To achieve this, for example the stack is placed between two plates defining a fixed distance E between them. This distance E is between [e−2 nm; e+2 nm], preferably between [e−1 nm; e+2 nm]. For example, the plates form a single-part assembly. For example, the stack is slid between the plates.

Thus, the two elements are held in contact with each other but no force is applied to bring them together. The only function of the holding elements is to prevent the elements from separating from each other beyond a given clearance, and they do not apply a pressure to bring the free surfaces of the pads in contact with each other.

Figure 2B:
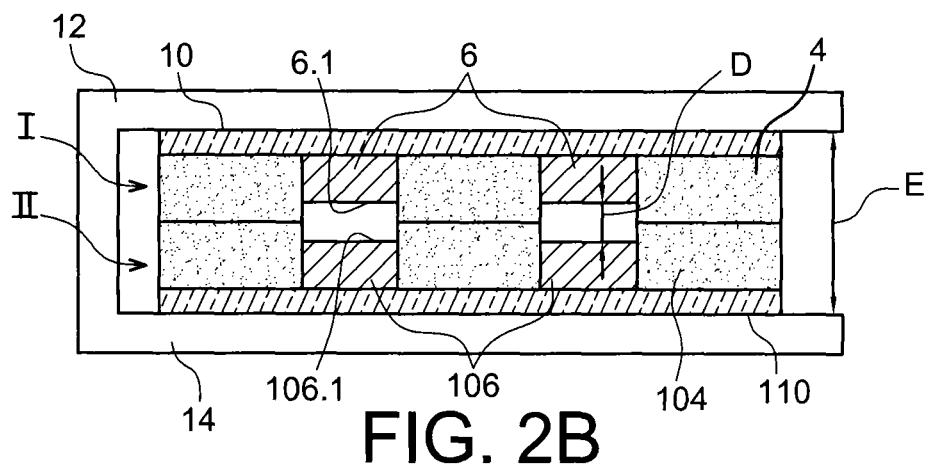

FIG. 2B shows elements I and II placed between the two holding plates 12 and 14 separated by the fixed distance E. In this example, the two plates 12 and 14 form a rigid assembly inside which the stack of elements is inserted. The heat treatment has not yet begun.

Figure 2C:
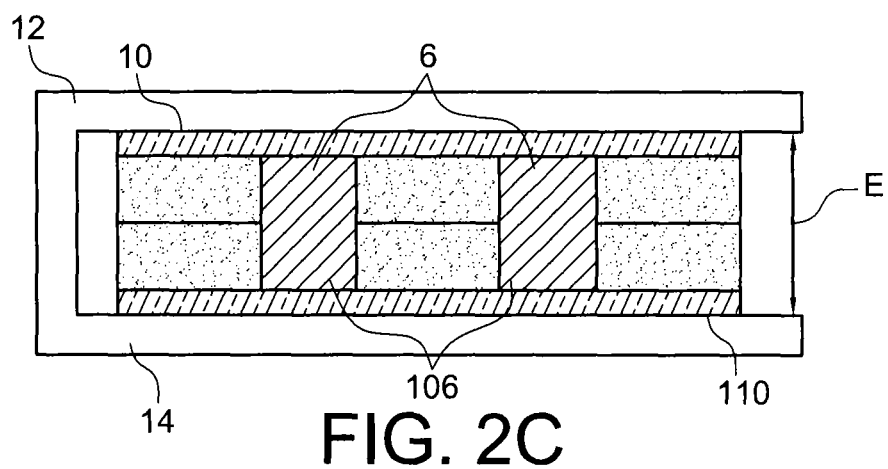

During this step B), the copper pads expand and come into contact and bonding takes place between the pads. FIG. 2C shows that the distance D has been filled in.

The heat treatment temperature is typically between 50° C. and 400° C. and the treatment duration is between 10 min and 10 hours. Expansion of the pads depends on the heat treatment temperature. The heat treatment temperature and duration are chosen as a function of the dishing; as dishing increases, the temperature required to obtain sufficient expansion will also increase, at least during a first heat treatment phase.

The temperature during the heat treatment is not necessarily constant and it can vary.

The surface area of the holding plates 12, 14 is at least equal to the surface area of the back faces of the elements so as to hold them together over the entire surface area of the bonding interface.

Figure 3:
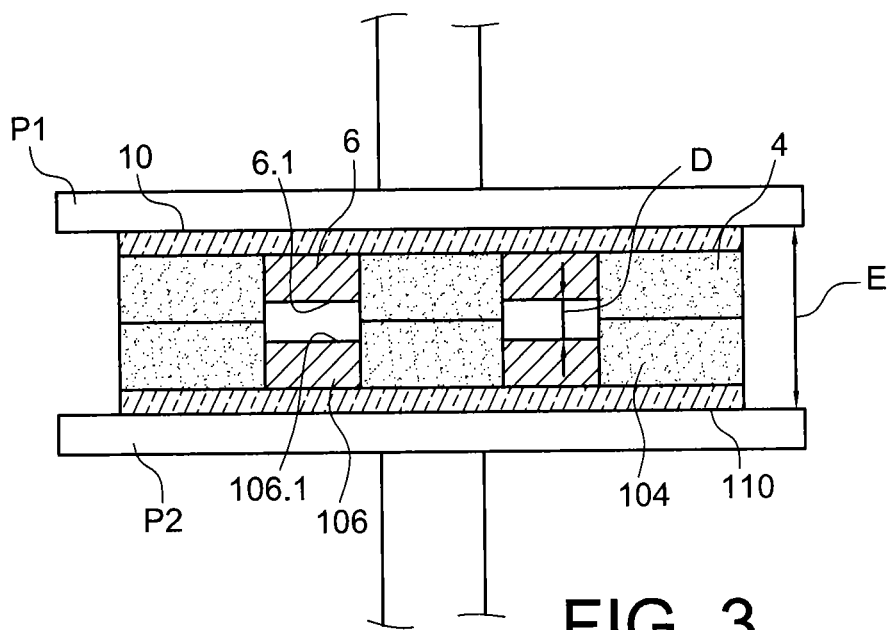
FIG. 3 is a diagrammatic view of a variant embodiment of the heat treatment step in which support is provided by two pistons.

On the variant shown in FIG. 3, the stack may be placed between two pistons P1 and P2 activated only to hold the elements in contact with each other. The distance separating the tips of the two pistons during the heat treatment is then between [e−2 nm; e+2 nm], preferably between [e−1 nm; e+2 nm]. It may also be held between a piston and a table. In FIG. 3, the distance D has not yet been filled in by expansion of the copper portions.

Advantageously, a thin layer of soft material, for example a polymer, can be inserted between the plates or the holding pistons and the back faces of the elements, to compensate for roughness on the back faces of the assembled elements. The film thickness is of the order of a few nm such that the material becomes incompressible when it is squeezed between a holding plate and the back face of an element.

It is possible that the element(s) to be assembled is (are) not perfectly plane, because the element(s) is (are) curved.

The stack is also curved at the end of the contact step.

A flattening step of the stack can then be applied before or during the heat treatment step. This is done by applying a force on the stack so as to cancel the curvature of the stack. The force that can then be applied is not more than 3 kN. For example, the maximum curvature for bonding a 200 mm wafer is of the order of 30 μm, the force to be applied is then not more than 3 kN. In general, the curvature is of the order of 10 μm and the force to be applied is of the order of 1 kN.

This flattening force may for example be applied by one of the pistons that bears on the convex area of the stack. Note that the intensity of the force required to flatten a stack of two elements is very small compared with the compression force applied when a thermocompression technique is used.

The flattening step may be done before step A, for example this is done by flattening the curved element or the two curved elements.

This flattening may be done by suction means that straighten the element(s). For example, it could be a table provided with orifices in which a vacuum is created. The suction means can also be used when flattening takes place after step A).

As a variant, a device could be provided comprising a plurality of superposed housings each delimited by two surfaces separated by a distance E between [e−2 nm; e+2 nm], preferably between [e−1 nm; e+2 nm]. Each stack is slid into a housing. The heat treatment step is then applied to the collective holding device. When the stacks are inserted in the housings, a flattening step is automatically performed on stacks with a curvature.

It will be understood that this collective device can be used in the case in which the stacks do not have any curvature.

Alternately, several stacks could be placed side by side on a table and they could be held in place collectively by a single plate at a distance from the table of between [e−2 nm; e+2 nm], and preferably [e−1 nm; e+2 nm].

We will now describe assembly examples in which the heat treatment step takes place with or without a holding device in order to demonstrate the advantages of this invention.

We will consider a misalignment of 500 nm between the two wafers, i.e. between facing pads, during the bonding step.

In a first example, it is assumed that two 500 nm high 3 μm square copper pads are to be bonded with 10 nm dishing on each pad. The heat treatment takes place at a temperature of 400° C.

At the end of the first bonding step at ambient temperature, the metal interface between the two elements is not completely closed and the maximum separation between the two free surfaces of the facing pads is 19.2 nm.

In the case of a heat treatment without holding the elements, the separation between the two surfaces at the end of the heat treatment is 7.9 nm.

When the two elements have been assembled using the method according to the invention, and more particularly when the two elements are held in contact with each other during the heat treatment step as described above, it is found that the separation between the two surfaces at the end of the heat treatment is zero, the separation of 19.2 nm between the free faces of the pads facing each other has been entirely filled in.

A second example applies to bonding of two 3 μm wide, 500 nm high copper lines with 7 nm dishing on each pad.

The heat treatment takes place at a temperature of 200° C.

The metal interface at the end of the first bonding step between the two elements at ambient temperature is not completely closed and the maximum separation between the two free surfaces of the pads is 13.3 nm.

In the case of a heat treatment without holding the elements, the separation between the two surfaces at the end of the heat treatment is 7.5 nm.

When the two elements are assembled using the method according to the invention, and more particularly when the two elements are held in place during the heat treatment step, it is observed that the separation between the two surfaces at the end of the heat treatment is null, the separation of 13.3 nm between the free faces of the lines has been completely filled in.

A third example applies to bonding of two 10 μm wide, 500 nm high copper lines with 15 nm dishing on each pad. The heat treatment takes place at a temperature of 400° C.

The metal interface between the two elements at the end of the first bonding step at ambient temperature is not completely closed and the maximum separation between two free surfaces of the pads facing each other is 29.9 nm.

In the case of a heat treatment without holding elements, the separation between the two surfaces at the end of the heat treatment is 19.9 nm.

When the two elements are assembled using the method according to the invention, and more particularly when the two elements are held in contact with each other during the heat treatment step, it is found that the separation between the two surfaces at the end of the heat treatment step is null, the separation of 29.9 nm between the free faces of the lines has been completely filled in.

The second example and the third example show that in using the invention it is possible to either obtain bonding for a given initial dishing with a lower heat treatment temperature, or to obtain bonding for larger dishing with the same heat treatment temperature.

A fourth example applies to bonding of two 10 μm wide, 350 nm high copper lines with 10 nm dishing on each pad. The heat treatment takes place at a temperature of 400° C.

The metal interface between the two elements is not completely closed at the end of the first bonding step at ambient temperature, and the maximum difference between two free surfaces of the pads facing each other is 19.8 nm.

For a heat treatment without holding the elements, the separation between the two surfaces at the end of the heat treatment is 18.9 nm.

When the two elements are assembled using the method according to the invention, and more particularly when the two elements are held in contact with each other during the heat treatment step, it is found that the difference between the two surfaces at the end of the heat treatment is zero, the separation of 29.9 nm between the free faces of the lines has been completely filled in.

These examples show that the direct bonding assembly method according to this invention is more efficient than the assembly method by direct bonding according to the state of the art.

In the examples described, the copper portions of the two elements to be assembled have the same dishing. In general, the two elements will have similar or even equal dishing because they were prepared using the same techniques. But it will be understood that the method according to the invention is also applicable to the assembly of elements for which the dishing of the metal portions is different. Preferably, the maximum combined dishing of the two metal pads to be assembled is less than or equal to 40 nm.

Figure 6:
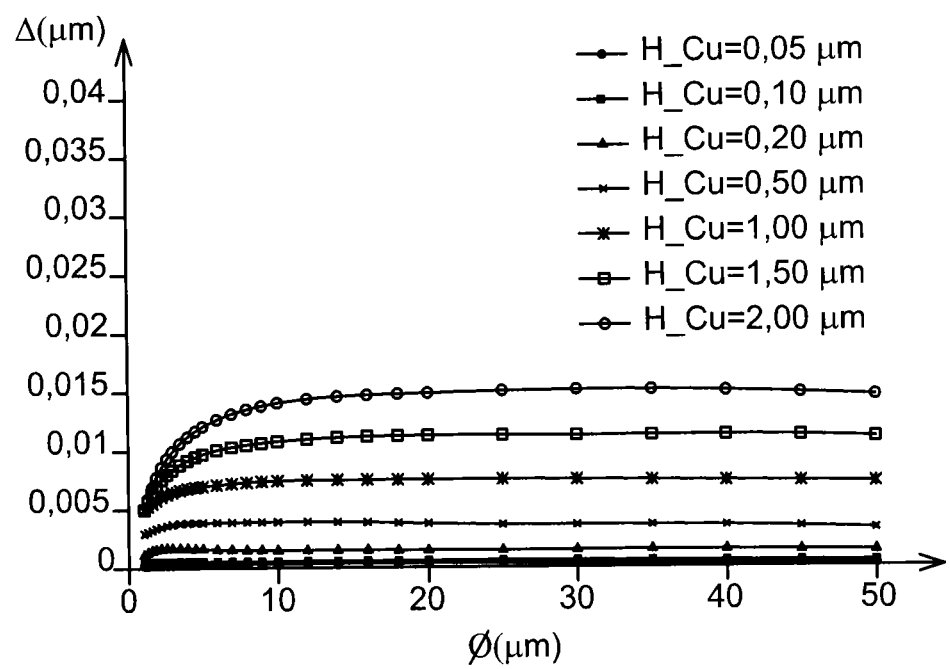
FIG. 6 is a graphic view of the displacement in μm of the free central zone of a copper pad as a function of its diameter in μm when heat treatment is applied to it at 200° C. for different pad heights in μm.

FIG. 6 shows the displacement Δ of the free central zone of a copper pad alone in μm as a function of its diameter φ in μm when a heat treatment is applied to it at 200° C. for different pad heights H in μm. It can be seen that the displacement of the free surface of the pad is proportional to its diameter and height, in other words the volume of the material in the pad. These measurements were not made for the method according to the invention. They give an approximate idea about the quantity of material required to fill in a given dishing for a given temperature.

In the assembly method according to the invention in which the two elements are held together at least during a first heat treatment phase, the displacement of the free surfaces is amplified and can fill in larger dishings.

It will also be understood that this invention is applicable to the assembly of an element I or I' like that described with another element for example formed from an entirely metal surface or entirely formed from a dielectric material.

With this invention, a heat treatment can be carried out at a lower temperature or a larger dishing can be accepted without changing the temperature of the heat treatment. The temperature of the heat treatment can thus be adjusted as a function of the dishing, which advantageously can control energy costs. Furthermore in the micro and nanoelectronic fields, this can reduce the temperatures applied to the elements thus preventing deterioration to the elements.

According to one variant embodiment, the elements are held in place only during a first phase of the heat treatment, and then during a second phase, the support is eliminated and the heat treatment continues at the same temperature or at a different temperature.

For example during a first phase, the temperature may be 400° C. for 10 minutes and then 200° C. during a second phase lasting several hours. The period during which the elements are at a high temperature can thus be limited.

For example, with this variant a first individual heat treatment phase can be followed by a second collective heat treatment phase.

Advantageously, step A and/or step B can be done under a vacuum. Bringing elements into contact under a vacuum can avoid trapping of air bubbles and more generally gas in the dishing(s).

Step B can also be done under a vacuum so that the vacuum can be maintained until the bonding is complete if bonding at the dielectric is not sufficient to isolate dishing zones during step A.

This invention has the advantage that it can compensate for differences in dishing in different pads of elements to be assembled.

The invention claimed is:

1. A method of assembly of a first element and a second element each having a back face and an assembly surface by direct bonding, at least the assembly surface of the first element comprising at least one first portion with at least one first metal part surrounded by at least one dielectric material, said first metal part having a free surface recessed from the dielectric material at said assembly surface, said method comprising:
   a step A) to bring the two assembly surfaces into contact such that direct bonding is obtained between the assembly surfaces, said step taking place at ambient temperature, said first and second elements forming a stack with a thickness, and
   a step B) taking place after step A), said step B) comprising
   B1) a step to hold the back faces of the first and the second elements in position so that they are immobilized,
   B2) a step to apply a heat treatment to said stack, wherein
      during a first phase of the heat treatment, the back faces of the first and second elements are held in place and a first heat treatment temperature between 50° and 400° C. is constantly applied to the stack for a first time period, and
      during a second phase of the heat treatment, the first and second elements are no longer held in place and a second heat treatment temperature between 50° and 400° C. is constantly applied to the stack for a second time period.

2. The assembly method according to claim 1, in which during step B1 and the first phase of B2, the back faces of the first and second elements are held in position such that they are held at a fixed distance between the stack thickness−1 nm and the stack thickness+1 nm.

3. The assembly method according to claim 1, in which the assembly surface of the second element comprises at least one second portion having a second metal part surrounded by at least one dielectric material, said second metal part having a free surface recessed from the dielectric material at said assembly surface, and in which contact is made during step A) so as to align the first metal part of the first element and the second metal part of the second element.

4. The assembly method according to claim 1, in which during step B1 and the first phase of B2, the stack is placed in a holding device with two planar members positioned in plane arrangement with the back faces of the first and second elements, respectively, a distance separating the members being between the stack thickness−2 nm and the stack thickness+2 nm.

5. The assembly method according to claim 3, in which the respective recess of the surfaces of the first and second metal parts from the dielectric material is less than or equal to 20 nm.

6. The assembly method according to claim 1, in which step A) takes place at ambient temperature and atmospheric pressure.

7. The assembly method according to claim 1, said stack being curved, said method comprises a stack flattening step after step A) and before and/or during the heat treatment in order to eliminate said curvature.

8. The assembly method according to claim 7, in which a force of less than 3 kN is applied to the stack so as eliminate the curvature.

9. The assembly method according to claim 1, in which, before step A), there is at least one assembly surface polishing step such that roughness of the assembly surfaces is less than 0.7 nm RMS, and hydrophily is less than 20°.

10. The assembly method according to claim 4, the planar members of said holding device are at least as large as a surface area of the back faces of the first and second elements.

11. The assembly method according to claim 3, in which the first and second metal parts are made of copper, aluminum, tungsten, or titanium, and the dielectric material is an oxide or a nitride.

12. The assembly method according to claim 1, in which several first elements are assembled to several second elements simultaneously.

13. The assembly method according to claim 3, in which the first and the second elements are microelectronic and/or nanoelectronic substrates, the first and second metal parts forming electrical interconnections.

14. The assembly method according to claim 11, wherein the dielectric material is an oxide comprising one of $SiO_2$, SiOCH and $Al_2O_3$ or the dielectric material is a nitride comprising $Si_3N_4$.

15. The assembly method according to claim 1, wherein the second heat treatment temperature is selected as a function of a distance of the recess of the free surface of the first metal part from the dielectric material at the assembly surface at a beginning of the heat treatment.

16. The assembly method according to claim 1, wherein the first heat treatment temperature is equal to the second heat treatment temperature.

17. The assembly method according to claim 1, wherein the second heat treatment temperature is lower than the first heat treatment temperature.

* * * * *